(12) United States Patent
Ogihara

(10) Patent No.: US 8,796,814 B2
(45) Date of Patent: Aug. 5, 2014

(54) SEMICONDUCTOR MEMORY DEVICE AND METHOD OF MANUFACTURING THE SAME

(75) Inventor: Hirotaka Ogihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 13/420,318

(22) Filed: Mar. 14, 2012

(65) Prior Publication Data

US 2013/0126995 A1 May 23, 2013

(30) Foreign Application Priority Data

Nov. 21, 2011 (JP) ................................. 2011-254158

(51) Int. Cl.
*H01L 29/82* (2006.01)
*H01L 21/8246* (2006.01)

(52) U.S. Cl.
USPC ............ 257/529; 257/E21.665; 257/E29.323; 438/763

(58) Field of Classification Search
USPC .......... 257/108, 295–326, 288, 529, E21.665, 257/E29.323; 438/763
See application file for complete search history.

(56) References Cited

U.S. PATENT DOCUMENTS

| 2005/0124176 | A1 | 6/2005 | Sugino et al. | |
|---|---|---|---|---|
| 2009/0302404 | A1* | 12/2009 | Matsuda et al. | ............... 257/421 |
| 2010/0200900 | A1 | 8/2010 | Iwayama | |
| 2012/0032288 | A1* | 2/2012 | Tomioka | ....................... 257/421 |

FOREIGN PATENT DOCUMENTS

| JP | 2008-141210 A | 6/2008 |
|---|---|---|
| JP | 2008-263212 A | 10/2008 |
| JP | 2010-186869 A | 8/2010 |

* cited by examiner

*Primary Examiner* — Daniel Shook
(74) *Attorney, Agent, or Firm* — Knobbe, Martens, Olson & Bear, LLP

(57) ABSTRACT

According to one embodiment, a semiconductor substrate device includes a plurality of memory elements formed on the top surface of a semiconductor substrate, interlayer insulating films buried between the adjacent memory elements, a protection film formed on sides of each of the memory elements and the top surface of the semiconductor substrate between the adjacent memory elements, and contacts formed in the interlayer insulating films. The protection film includes a first protection film formed on the sides of each of the memory elements and the top surface of the semiconductor substrate between the adjacent memory elements and a second protection film formed on the first protection film. The first protection film is made of a silicon oxide film, a silicon nitride film, or a silicon oxynitride film, and the second protection film is made of a boron film or a boron nitride film.

15 Claims, 8 Drawing Sheets

US 8,796,814 B2

SEMICONDUCTOR MEMORY DEVICE AND METHOD OF MANUFACTURING THE SAME

CROSS-REFERENCE TO RELATED APPLICATION

This application is based upon and claims the benefit of priority from prior Japanese Patent Application No. 2011-254158, filed on Nov. 21, 2011, the entire contents of which are incorporated herein by reference.

FIELD

Embodiments of the present invention relate to a semiconductor memory device and a method of manufacturing the same.

BACKGROUND

In recent years, various technologies are suggested to realize a magnetic random access memory (MRAM) using a tunneling magnetoresistive (TMR) effect or a giant magnetoresistive (GMR) effect.

The MRAM that is one of nonvolatile semiconductor memory devices has a magnetic tunnel junction (hereinafter, simply referred to as MTJ) element. In detail, the MTJ element basically has a stack structure that includes three layers of a memory layer made of a magnetization film to store data by changing a magnetization direction, a reference layer made of a magnetization film using magnetization fixed in one direction, and a tunnel junction layer (nonmagnetic layer) made of an insulating film formed between the memory layer and the reference layer. If an electric current flows to the MTJ element including the memory layer, the tunnel junction layer, and the reference layer, a resistance value of the MTJ element changes due to a change in the magnetization direction of the memory layer with respect to the magnetization direction of the reference layer caused by the TMR effect. Specifically, when the magnetization directions of the memory layer and the reference layer are parallel to each other, the resistance value becomes a minimum value and when the magnetization directions are anti-parallel to each other, the resistance value becomes a maximum value. This state is stored as information of "1" or "0".

In the MRAM, many technologies are suggested for practical use. Because inversion of a magnetization direction by a spin-polarized current is theoretically and experimentally confirmed, an MRAM using the spin-polarized current is suggested as one of the technologies. According to the suggestion, magnetization inversion of a magnetic layer can be realized by only an amount of the spin-polarized current flowing in the magnetic layer. If the volume of the magnetic layer is small, spin-polarized electrons that are injected to invert the magnetization of the magnetic layer decrease. Therefore, it is expected that both miniaturization and a reduced current can be realized.

DETAILED DESCRIPTION OF THE INVENTION

In one embodiment, a semiconductor substrate device includes: a plurality of memory elements formed on a top surface of a semiconductor substrate; an interlayer insulating film buried between the adjacent memory elements; a protection film formed on sides of each of the memory elements and the top surface of the semiconductor substrate between the adjacent memory elements; and a contact formed in the interlayer insulating film, wherein the protection film includes: a first protection film formed on the sides of each of the memory elements and the top surface of the semiconductor substrate between the adjacent memory elements, the first protection film being made of a silicon oxide film, a silicon nitride film, or a silicon oxynitride film; and a second protection film formed on the first protection film, the second protection film being made of a boron film or a boron nitride film.

Hereinafter, embodiments will be described with reference to the drawings. However, the present invention is not limited to the embodiment. Like reference numbers refer to like elements in all of the drawings and the redundant description will not be repeated. In addition, the drawings are schematic views to promote explanation of the present invention and the understanding thereof, and the shapes, dimensions, and ratios thereof may be different from those of real devices. However, a design can be appropriately changed in consideration of the following explanation and a well-known technology.

(First Embodiment)

Figure 1:
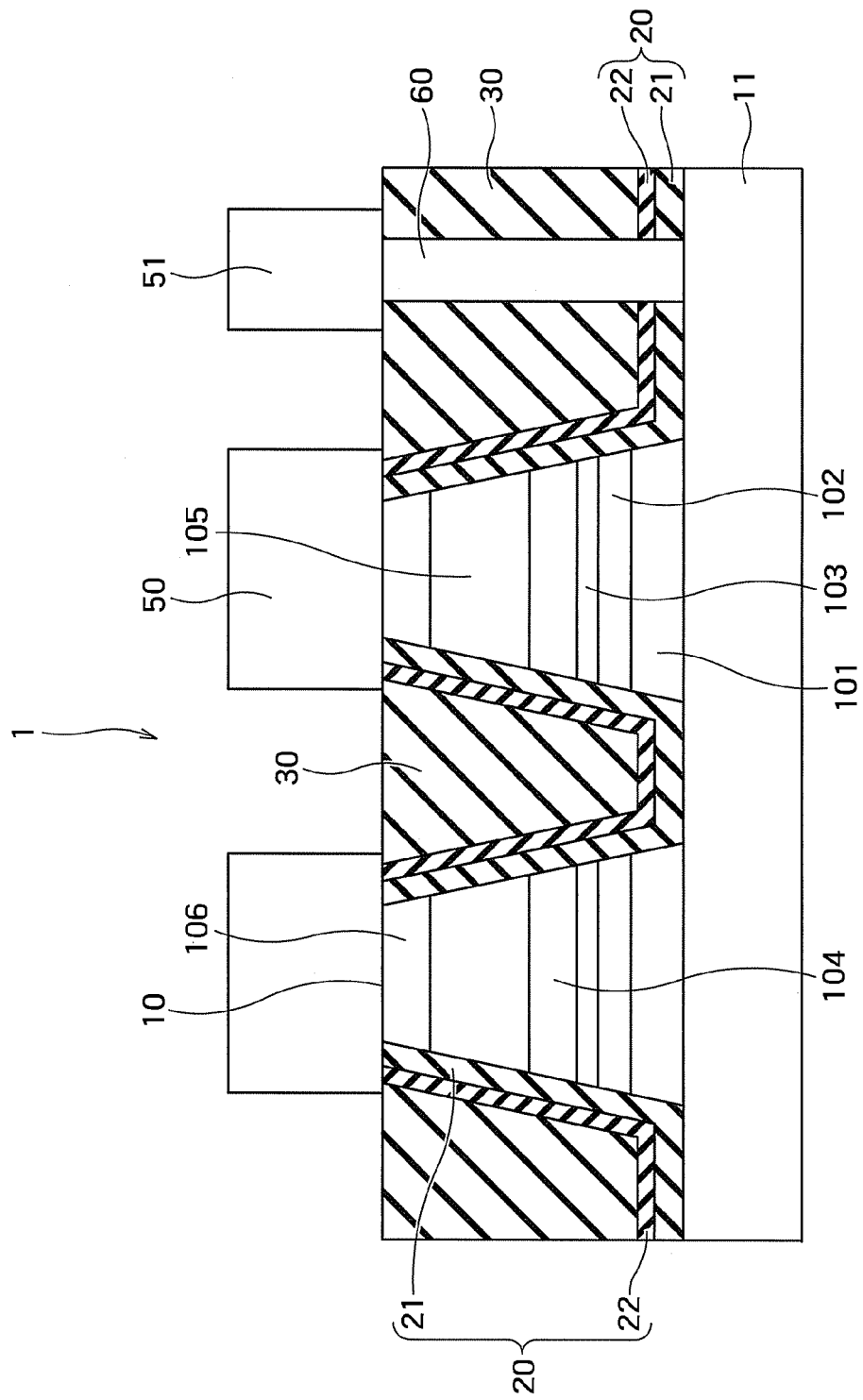
FIG. 1 is a cross-sectional view of a semiconductor memory device according to a first embodiment.

An MRAM (semiconductor memory device) 1 according to the first embodiment will be described with using FIG. 1. FIG. 1 is a cross-sectional view illustrating the MRAM 1 according to the first embodiment. In the present embodiment, an MTJ element (memory element) 10 and a protection film 20 to cover the MTJ element will be described. However, the present invention is not limited to the semiconductor memory device to be described below. The present invention can be applied to various types of MRAMs and also can be applied to a resistance change element included in a resistance change random access memory (ReRAM).

As illustrated in FIG. 1, the MRAM 1 according to the present embodiment has a plurality of MTJ elements 10 that are formed on a top surface of a semiconductor substrate 11, an interval between the adjacent MTJ elements 10 is, for example, 60 nm, and interlayer insulating films 30 are buried between the MTJ elements. The MTJ element 10 has a stack structure including, for example, a base layer 101, a memory layer 102, a tunnel junction layer 103, a reference layer 104, a cap layer 105, and a contact layer 106 sequentially deposited on the semiconductor substrate 11. However, the structure of the MTJ element 10 according to the present embodiment is not limited to the stack structure described above and may be another stack structure. The interlayer insulating film 30 is made of a silicon oxide film and fills spaces between the MTJ elements 10 by using spin on glass (SOG).

In addition, sides of the MTJ elements 10 and the top surface of the semiconductor substrate 11 between the MTJ elements 10 are continuously covered with the protection film 20. The protection film 20 may cover a part of the top surface of each MTJ element 10. In detail, the protection film 20 includes a first protection film 21 that is continuously formed on the sides of the MTJ elements 10 and the top surface of the semiconductor substrate 11 between the MTJ elements 10 and a second protection film 22 that is continuously formed on the first protection film 21. Each of the first protection film 21 and the second protection film 22 is a conformal film that does not expose the sides of the MTJ element 10 and the top surface of the semiconductor substrate 11. The thickness of the protection film 20 where the first protection film 21 and the second protection film 22 align is preferably 10 nm or less at the sides of the MTJ element 10. This is because, if the thickness becomes larger than 10 nm, an interval of the adjacent MTJ elements 10 becomes narrowed and it becomes difficult to fill a space between the adjacent MJT elements 10 with the interlayer insulating film 30 without generating a void. As such, because the thickness of the protection film 20 is small, strong stress can be prevented from being applied from the protection film 20 to the MTJ element 10 and a characteristic of the MTJ element 10 can be prevented from being deteriorated due to the stress.

The first protection film 21 is made of a silicon oxide film, a silicon nitride film, or a silicon oxynitride film and has electrical insulating properties and low permittivity. Therefore, by using the first protection film 21, the individual layers forming the MTJ element 10 can be electrically insulated from each other, the parasitic capacity generated between the adjacent MTJ elements 10 can be prevented from increasing, and moisture or oxygen from the interlayer insulating film 30 can be prevented from being permeated into the MTJ element 10. In detail, when the first protection film 21 is formed of the silicon oxide film, the parasitic capacity can be more surely prevented from increasing and when the first protection film 21 is formed of the silicon nitride film, the moisture or the oxygen can be more surely prevented from being permeated into the MTJ element 10. When the first protection film 21 is formed of the silicon oxynitride film, the first protection film 21 can have the functions of the silicon oxide film and the silicon nitride film.

The second protection film 22 is made of a boron film such as a crystalline boron film or an amorphous boron film and a boron nitride film. Because atomic bonding of the boron film or the boron nitride film is covalent bonding, the bonding is strong and the second protection film 22 is resistant to etching that is executed in the following process. Therefore, even though the thicknesses of the first protection film 21 and the second protection film 22, that is, the thickness of the protection film 20 is small, the second protection film that has etching resistance protects the first protection film from the etching. Therefore, the individual layers forming the MTJ element 10 can be electrically insulated from each other and the moisture or the oxygen from the interlayer insulating film 30 can be prevented from being permeated into the MTJ element 10.

In the protection film 20, when the first protection film 21 is thin and the second protection film 22 is thicker than the first protection film 21, because the film that has the etching resistance becomes thick, the film can be used as an etching stop film at the time of processing a contact hole 61. Meanwhile, when the first protection film 21 is thick and the second protection film 22 is thinner than the first protection film 21, the film that has the low permittivity becomes thick. Therefore, the parasitic capacity between the adjacent MTJ elements 10 can be more suppressed.

As illustrated in FIG. 1, a wiring line 50 that is electrically connected to each MTJ element 10 is disposed on the top surface of each MTJ element 10. The contact hole 61 is formed in the interlayer insulating film 30 between the adjacent MTJ elements 10 and a contact 60 that electrically connects the semiconductor substrate 11 and the wiring line 51 positioned on the interlayer insulating film 30 is formed.

Next, an example of a method of manufacturing the MRAM 1 according to the present embodiment will be described with using FIGS. 2A to 2H. FIGS. 2A to 2H are cross-sectional views of processes of the method of manufacturing the MRAM according to the present embodiment and correspond to a cross-section of the MRAM 1 illustrated in FIG. 1. In the present embodiment, a method of manufacturing the protection film 20 to cover the MTJ element 10 will be described. However, the present invention is not limited to a method of manufacturing a semiconductor memory device to be described below.

Figure 2A:
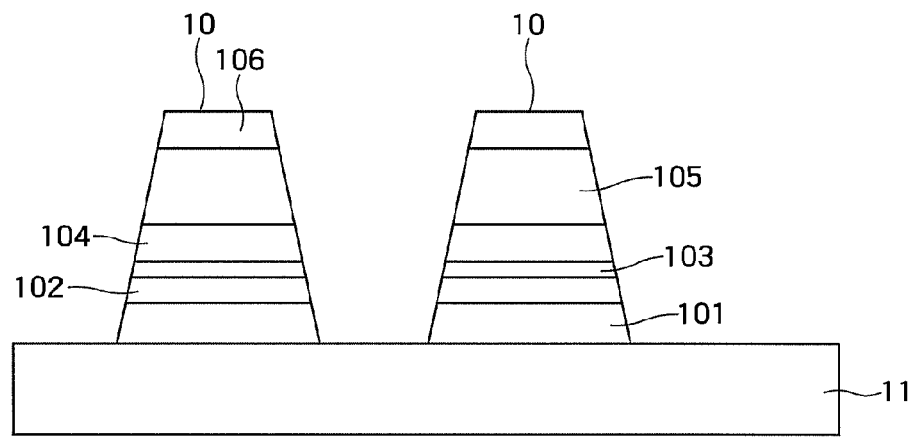
FIGS. 2A to 2H are cross-sectional views illustrating a method of manufacturing the semiconductor memory device according to the first embodiment.

As illustrated in FIG. 2A, the plurality of MTJ elements 10 are formed on the top surface of the semiconductor substrate 11 by using a known method. An interval between the adjacent MTJ elements 10 is, for example, 60 nm.

Figure 2B:
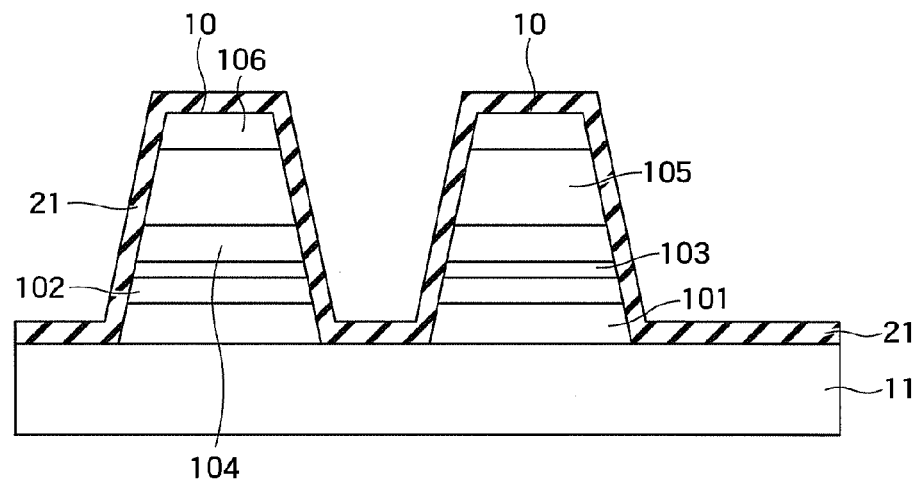

Next, as illustrated in FIG. 2B, the silicon nitride film, the silicon oxide film, or the silicon oxynitride film (first protection film) 21 is deposited to continuously cover the top surface and the sides of the MTJ element 10 and the top surface of the semiconductor substrate 11 positioned between the MTJ elements 10. That is, the silicon nitride film, the silicon oxide film, or the silicon oxynitride film 21 is formed as a conformal film that does not expose the sides of the MTJ element 10 and the top surface of the semiconductor substrate 11. The silicon nitride film, the silicon oxide film, or the silicon oxynitride film 21 may cover the top surface of the MTJ element 10. Formation of the silicon nitride film 21 will be described. The formation of silicon nitride film 21 can be formed by using a thermal atomic layer deposition (ALD) method, a plasma ALD (plasma assist ALD) method, a plasma CVD (plasma assist CVD) method, and a sputtering method.

In detail, the thermal ALD method is preferable because the silicon nitride film 21 having a high coverage rate of about 100% can be easily formed. However, because the process temperature is high, the thermal ALD method is not preferable in the case in which the MTJ element 10 includes a film vulnerable to the high temperature. The plasma ALD method has a low coverage rate as compared with a film formed by the thermal CVD method. However, the plasma ALD method is preferable because the silicon nitride film 21 having a coverage rate of 60 to 80% can be easily formed and a conformal film can be formed, even though the process temperature is low. The plasma CVD method is preferable because the silicon nitride film 21 having a coverage rate of 30 to 50% can be easily formed, but a film having high throughput can be obtained, even though the process temperature is low. The sputtering method is preferable because the silicon nitride film 21 having a coverage rate of 20 to 40% is easily formed, but a film having low hydrogen concentration is obtained, even though the process temperature is about the room temperature.

Figure 2C:
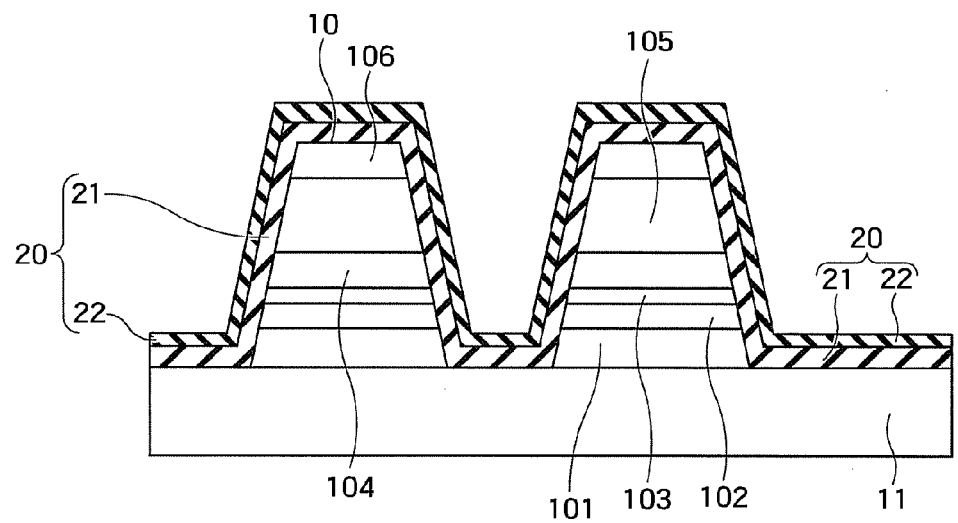

As illustrated in FIG. 2C, the boron film or the boron nitride film (second protection film) 22 is deposited by using a known method to continuously cover the silicon nitride film 21. That is, the boron film or the boron nitride film 22 is formed as a conformal film that does not expose the surface of the silicon nitride film 21. At this time, various methods can be selected. However, when the MTJ element 10 includes a film vulnerable to the high temperature, a method that does not make the process temperature become high is preferably selected. For example, the boron film or the boron nitride film 22 is formed by using the thermal CVD method of 300° C. or less using gas such as diborane, ammonia, and nitrogen. By changing a ratio of the gas, the boron film or the boron nitride film 22 that has a desired composition can be formed.

As described above, the silicon nitride film 21 and the boron film or the boron nitride film 22 are formed such that the thickness of the protection film 20 where the silicon nitride film 21 and the boron film or the boron nitride film 22 align becomes 10 nm or less at the sides of the MTJ element 10. If the total thickness of the films becomes 10 nm or less at the sides of the MTJ element 10, the thickness of each of the silicon nitride film 21 and the boron film or the boron nitride film 22 can be changed according to properties required for the protection film 20. When the protection film 20 is formed on the top surface of the MTJ element, the thickness of the protection film 20 on the top surface of the MTJ element 10 may be thinner than the thickness of the film at the sides of the MTJ element 10.

Figure 2D:
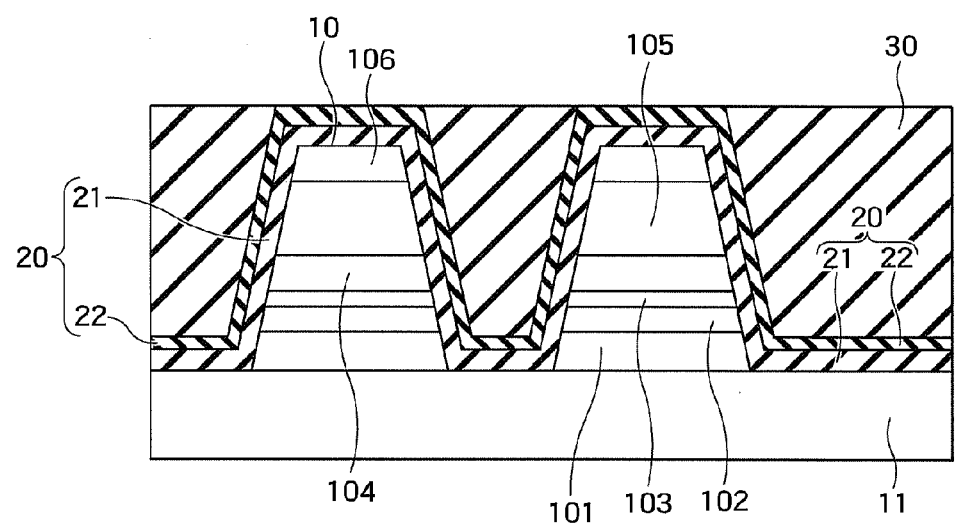

As illustrated in FIG. 2D, the interlayer insulating film 30 is formed by using the SOG to fill spaces between the MTJ elements 10 covered with the protection film 20 and the top surfaces thereof are flattened by using chemical mechanical polishing (CMP).

Figure 2E:
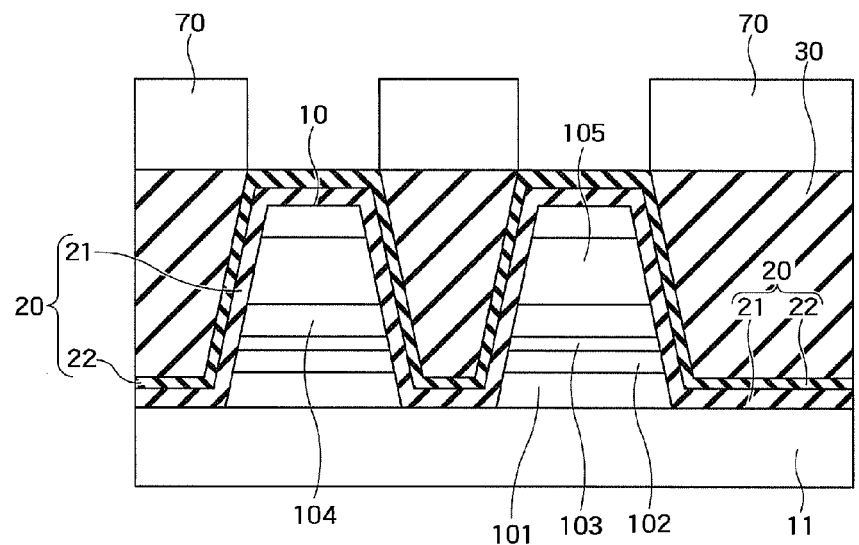

Next, as illustrated in FIG. 2E, a mask 70 is formed on the top surface of the MTJ element 10 covered with the protection film 20 and the top surface of the interlayer insulating film 30. The mask 70 is formed to cover the top surface of the interlayer insulating film 30 and expose the top surface of the MTJ element 10 covered with the protection film 20.

Figure 2F:
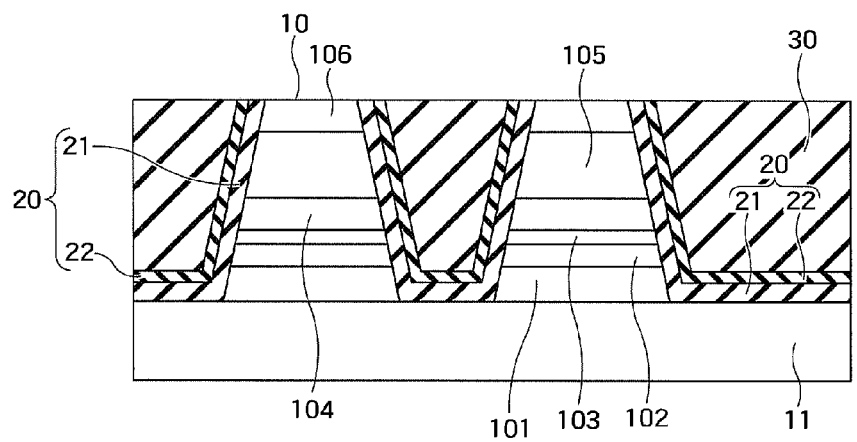

In addition, the protection film 20 that is exposed from the mask 70, that is, the protection film 20 that is positioned on the top surface of the MTJ element 10 is removed. If the mask 70 is removed and the interlayer insulating film 30 is flattened, a structure illustrated in FIG. 2F is obtained.

Figure 2G:
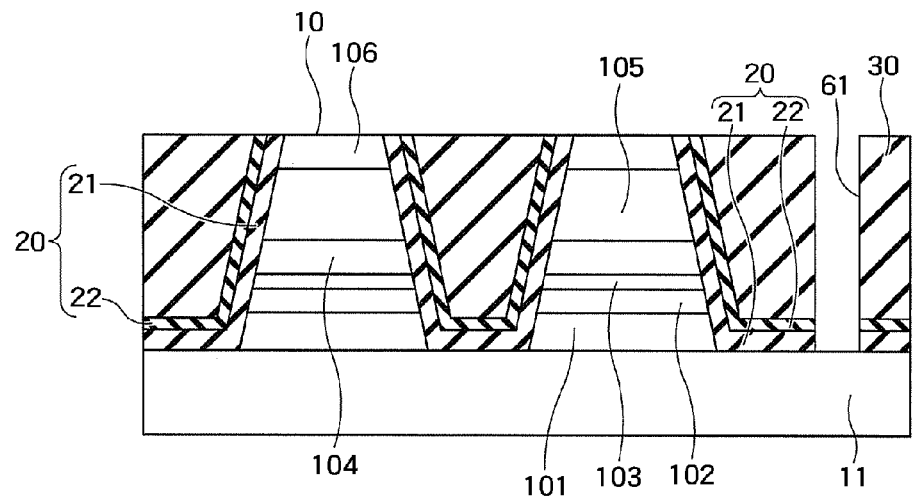

Next, as illustrated in FIG. 2G, the contact hole 61 is formed by using dry etching such as reactive ion etching (RIE) in the interlayer insulating film 30 between the adjacent MTJ elements 10.

Figure 2H:
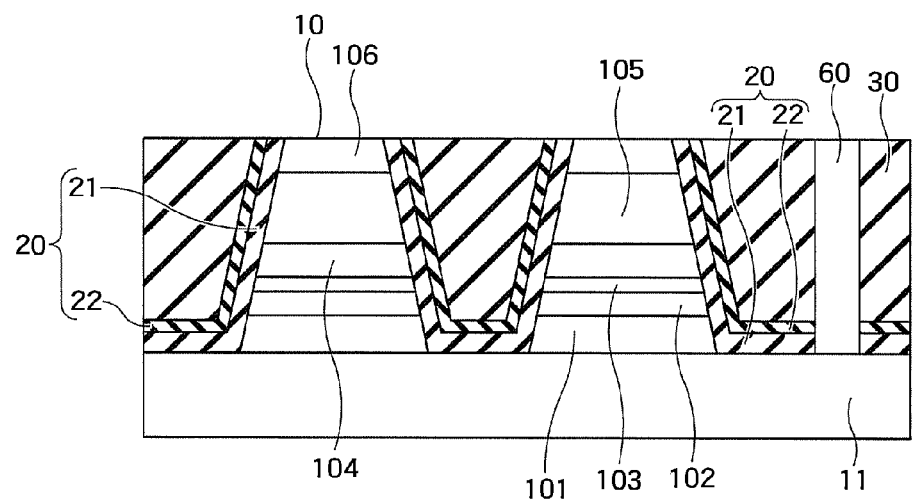

As illustrated in FIG. 2H, the contact 60 is formed in the contact hole 61.

The MRAM 1 according to the present embodiment is formed through the known processes.

According to the present embodiment, the second protection film 22 made of the boron film or the boron nitride film is provided as a part of the protection film 20 and the second protection film is resistant to the etching. For this reason, even though the thickness of the protection film 20 is thin, the protection film 20 can be prevented from being etched in the etching process and the MTJ element 10 or the semiconductor substrate 11 can be protected from the etching.

In detail, when the minuteness is required with respect to the semiconductor memory device such as the MRAM 1 and the MTJ element 10 is miniaturized to correspond to the minuteness, the interval between the adjacent MTJ elements 10 is narrowed. For this reason, the width of a space to bury the interlayer insulating film 30 is narrowed, that is, an aspect ratio of the space increases. When the interlayer insulating film 30 is buried in the space having the high aspect ratio, it is difficult to prevent the void from being generated in the interlayer insulating film 30. Therefore, the thickness of the protection film 20 that covers the MTJ element 10 is preferably decreased to widen the interval between the MTJ elements 10 while miniaturizing the MTJ element 10. That is, in order to protect the MTJ elements 10 while widening the interval between the MTJ elements 10, preferably, the thickness of the protection film 20 is thin and the protection film 20 is a continuous conformal film that does not expose the sides of the MTJ element 10 and the top surface of the semiconductor substrate 11 positioned between the MTJ elements 10.

However, when the protection film 20 is made of only a thin film, for example, a thin silicon nitride film, the silicon nitride film has low resistance to the etching and the thickness thereof is thin. For this reason, when the contact hole 61 is formed by using the dry etching in the interlayer insulating film 30, the protection film 20 that is made of only the silicon nitride film may be etched, the protection film 20 may not show a function for protecting the MTJ element 10 and the memory layer 102, the reference layer 104, or the tunnel junction layer 103 of the MTJ element 10 made of the that may be easily deteriorated due to the oxygen or the moisture may be deteriorated due to the oxygen or the moisture from the interlayer insulating film 30. As a result, a magnetic characteristic of the MTJ element 10 may be deteriorated. The contact hole 61 may be penetrated into the semiconductor substrate 11.

According to the present embodiment, the second protection film 22 made of the boron film or the boron nitride film that is provided as a part of the protection film 20 is provided to cover the sides of the MTJ element 10 and the semiconductor substrate 11 between the adjacent MTJ elements 10. For this reason, the atomic bonding of the boron film or the boron nitride film is the strong covalent bonding. Therefore, because the protection film 20 has the etching resistance, even when the protection film 20 is formed to have the small thickness, the protection film 20 can be prevented from being etched in the etching process, the MTJ element 10 can be prevented from being deteriorated, and the semiconductor substrate 11 can be prevented from being etched.

According to the present embodiment, because the protection film 20 is formed to have the small thickness of 10 nm or less at the sides of the MTJ element 10, the interval between the adjacent MTJ elements 10 can be prevented from being narrowed and the interlayer insulating film 30 can be easily buried between the adjacent MTJ elements 10 without generating the void because of the protection film 20. In addition, the strong stress can be prevented from being applied from the protection film 20 to the MTJ element 10 and a characteristic of the MTJ element 10 can be prevented from being deteriorated.

According to the present embodiment, the sides of the MTJ element 10 and the semiconductor substrate 11 between the MTJ elements 10 are covered by the protection film 20 having the stack structure that includes the conformal first protection film 21 made of the silicon oxide film, the silicon nitride film, or the silicon oxynitride film and the conformal second protection film 22 made of the boron film or the boron nitride film formed on the first protection film 21. Therefore, the individual layers of the MTJ element 10 can be electrically insulated from each other and the moisture or the oxygen from the interlayer insulating film 30 can be prevented from being permeated into the MTJ element 10.

According to the present embodiment, because the protection film 20 that includes the first protection film 21 made of the silicon oxide film, the silicon nitride film, or the silicon oxynitride film and the second protection film 22 made of the boron film or the boron nitride film is formed by using the method described above, the MTJ element 10 is not oxidized and reduced due to the protection film 20 on the sides of the MTJ element 10 or the course of forming the protection film 20. Therefore, the characteristic of the MTJ element 10 can be prevented from being deteriorated. Because the conformal protection film 20 can be formed even though the process temperature at the time of forming the protection film is the low temperature of 300° C. or less, the characteristic of the MTJ element 10 can be prevented from being deteriorated due to the heat, when the protection film 20 is formed.

(Second Embodiment)

In the first embodiment, the protection film 20 includes the first protection film 21 and the second protection film 22. However, in the second embodiment, a protection film 23 that includes only a boron nitride film is used, different from the first embodiment. As such, a manufacturing cost and a manufacturing time of an MRAM 1 can be decreased by using the protection film 23 including only the boron nitride film.

Figure 3:
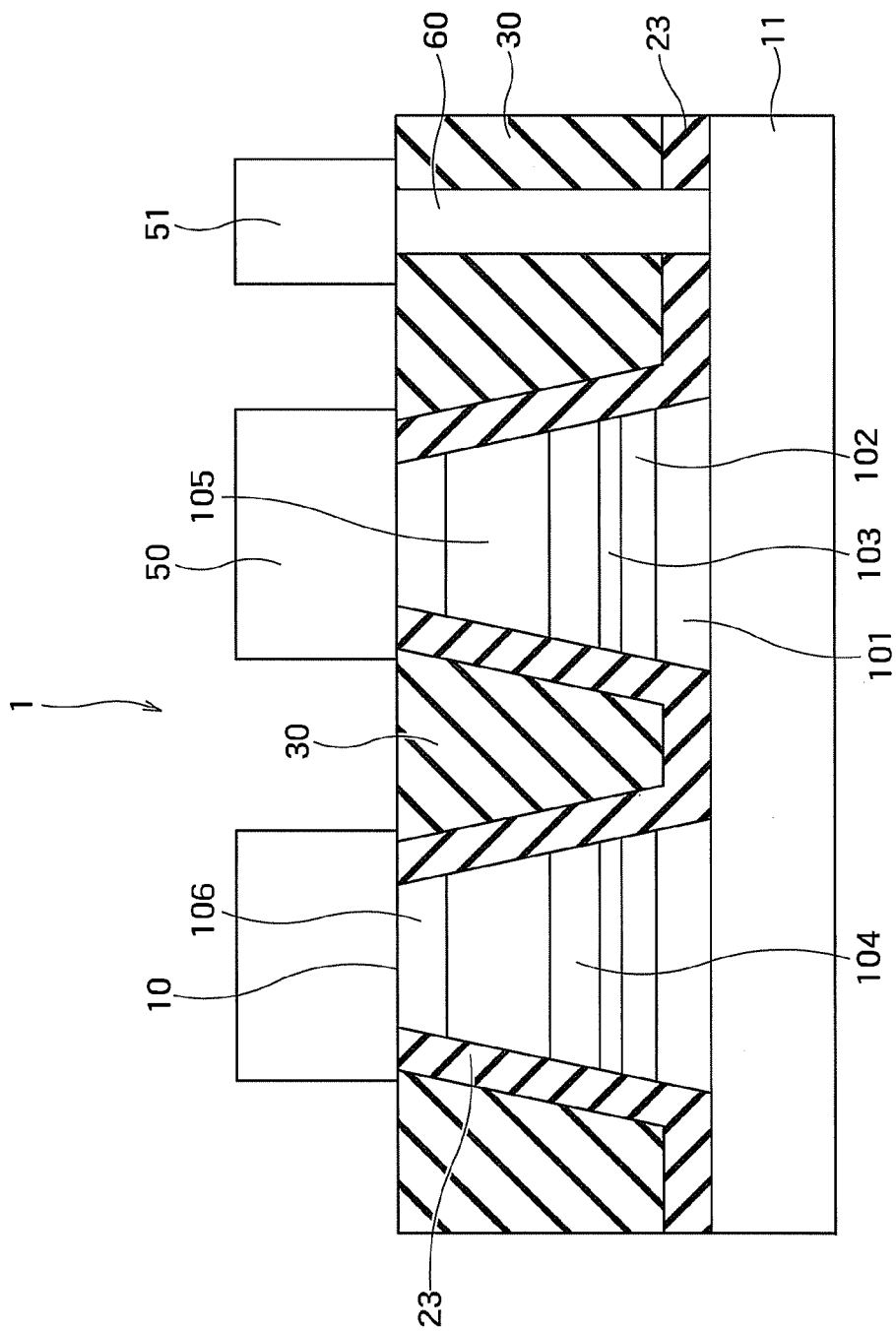
FIG. 3 is a cross-sectional view illustrating a semiconductor memory device according to a second embodiment.

The MRAM 1 (semiconductor memory device) 1 according to the second embodiment will be described with using FIG. 3. FIG. 3 is a cross-sectional view of the MRAM 1 according to the present embodiment. In the present embodiment, an MTJ element (memory element) 10 and a protection film 23 to cover the MTJ element will be described. However, the present invention is not limited to a semiconductor memory device to be described below. The present invention can be applied to various types of MRAMs and can be applied to a resistance change element included in a resistance change random access memory (ReRAM). In the following description of the second embodiment, components that have the same structures and functions as those of the first embodiment are denoted by the same reference numerals as those of the first embodiment and the redundant description is not repeated.

As illustrated in FIG. 3, the MRAM 1 according to the present embodiment has a plurality of MTJ elements 10 that are formed on a top surface of a semiconductor substrate 11 and interlayer insulating films 30 are buried between the adjacent. MTJ elements 10, similar to the first embodiment. The MTJ element 10 illustrated in FIG. 3 has the same stack structure as that of the first embodiment. However, the structure of the MTJ element 10 according to the present embodiment is not limited to the stack structure described above and may be another stack structure.

In addition, sides of the MTJ elements 10 and the top surface of the semiconductor substrate 11 between the MTJ elements 10 are continuously covered with the protection film 23. The protection film 23 may cover a part of the top surface of each MTJ element 10. In detail, the protection film 23 is made of a boron nitride film that is formed on the sides of the MTJ elements 10 and the top surface of the semiconductor substrate 11 between the MTJ elements 10, that is, the protection film 23 is a continuous conformal film that does not allow the sides of the MTJ element 10 and the top surface of the semiconductor substrate 11 to be exposed. Because the boron nitride film has insulating prosperities and atomic bonding thereof is covalent bonding, the boron nitride film has etching resistance. Similar to the first embodiment, the thickness of the protection film 23 is preferably 10 nm or less at the sides of the MTJ element 10. This is because, if the thickness becomes larger than 10 nm, an interval of the adjacent MTJ elements 10 becomes narrowed and it becomes difficult to bury the interlayer insulating film 30 between the adjacent MTJ elements 10 without generating a void. As such, because the thickness of the protection film 23 is small, strong stress can be prevented from being applied from the protection film 23 to the MTJ element 10 and a characteristic of the MTJ element 10 can be prevented from being deteriorated due to the stress. When the protection film 23 is formed on the top surface of the MTJ element, the thickness of the protection film 23 on the top surface of the MTJ element 10 may be smaller than the thickness at the sides of the MTJ element 10. Therefore, similar to the first embodiment, in the second embodiment, even though the thickness of the protection film 23 is small, the protection film 23 is not etched. Therefore, the protection film 23 can electrically insulate the individual layers forming the MTJ element 10 from each other and prevent the moisture or the oxygen from the interlayer insulating film 30 from being permeated into the MTJ element 10.

Next, an example of a method of manufacturing the MRAM 1 according to the present embodiment will be described with using FIGS. 4A to 4D. FIGS. 4A to 4D are cross-sectional views of processes of the method of manufacturing the MRAM according to the present embodiment and correspond to a cross-section of the MRAM 1 illustrated in FIG. 3. In the present embodiment, a method of manufacturing the protection film 23 to cover the MTJ element 10 will be described. However, the present invention is not limited to a method of manufacturing a semiconductor substrate to be described below. In the following description of the second embodiment, the same portions as those of the first embodiment are not described.

Figure 4A:
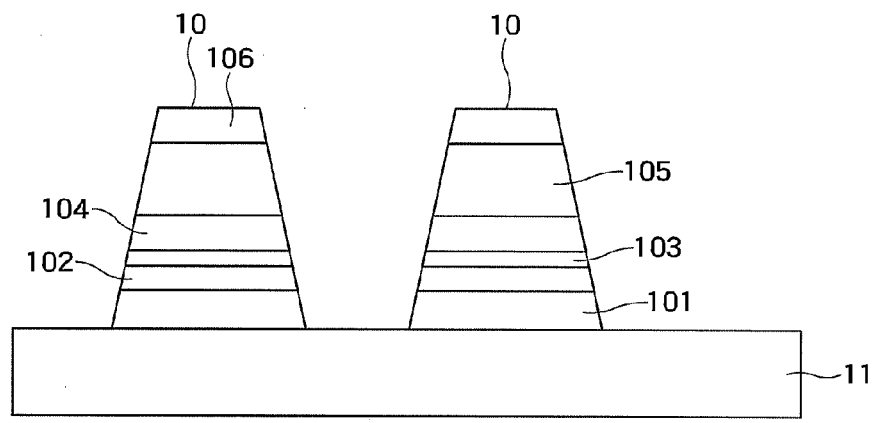
FIGS. 4A to 4D are cross-sectional views illustrating a method of manufacturing the semiconductor memory device according to the second embodiment.

As illustrated in FIG. 4A, similar to the first embodiment, the plurality of MTJ elements 10 are formed on the top surface of the semiconductor substrate 11 by using a known method.

Figure 4B:
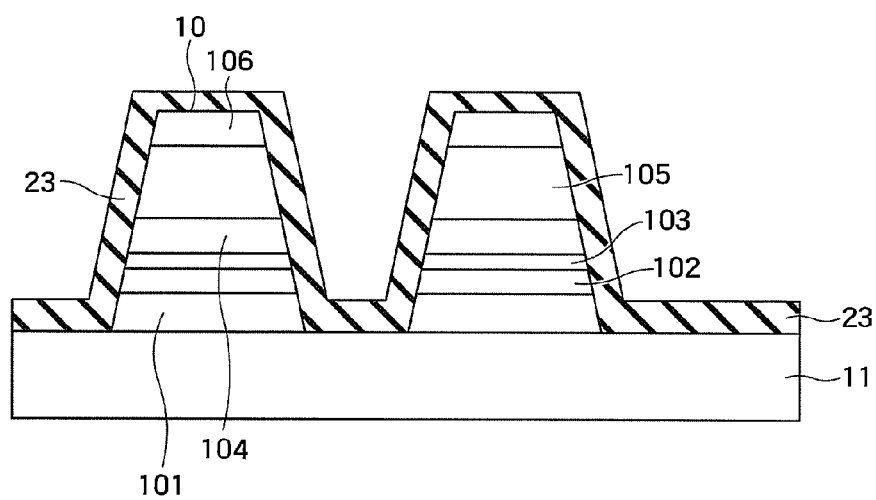

Next, as illustrated in FIG. 4B, the boron nitride film (protection film) 23 is deposited by using a known method to continuously cover the sides of the MTJ element 10 and the top surface of the semiconductor substrate 11 positioned between the MTJ elements 10. That is, the boron nitride film 23 is formed as a conformal film that does not expose the sides of the MTJ element 10 and the top surface of the semiconductor substrate 11. The boron nitride film 23 may cover the top surface of the MTJ element 10. At this time, various methods can be selected. When the MTJ element 10 includes a film vulnerable to the high temperature, a method that does not make the process temperature become high is preferably selected. For example, the boron nitride film 23 is formed by using the thermal CVD method of 300° C. or less using gas such as diborane, ammonia, and nitrogen. By changing a ratio of the gas, the boron nitride film 23 that has a desired composition can be formed.

Similar to the first embodiment, the boron nitride film 23 is formed to have the thickness of 10 nm or less at the sides of the MTJ element 10. When the boron nitride film 23 is formed on the top surface of the MTJ element, the thickness of the boron nitride film 23 on the top surface of the MTJ element 10 may be smaller than the thickness of the film at the sides of the MTJ element 10.

Figure 4C:
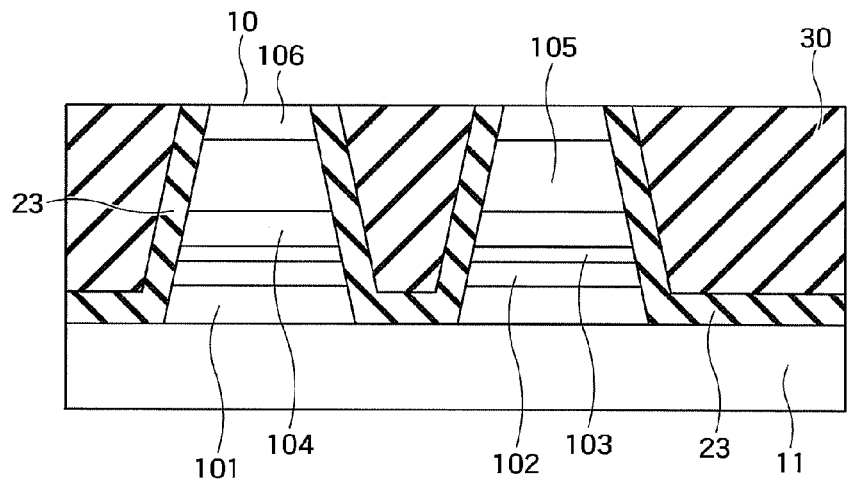

Similar to the first embodiment, the interlayer insulating film 30 is formed to bury spaces between the MTJ elements 10 covered with the protection film 23 and is flattened. A mask 70 is formed on the top surface of the MTJ element 10 covered with the protection film 23 and the top surface of the interlayer insulating film 30. The protection film 23 that is positioned on the top surface of the MTJ element 10 exposed from the mask 70 is removed. If the mask 70 is removed and the interlayer insulating film 30 is flattened, a structure illustrated in FIG. 4C is obtained.

Figure 4D:
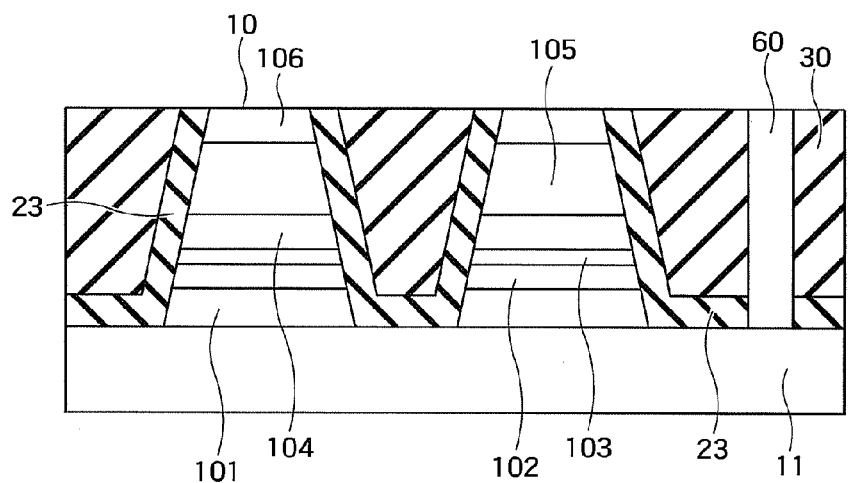

Next, as illustrated in FIG. 4D, a contact hole 61 is formed by using dry etching in the interlayer insulating film 30 between the adjacent MTJ elements 10 and a contact 60 is formed in the contact hole 61, similar to the first embodiment. The MRAM 1 according to the present embodiment is formed through the known processes.

According to the present embodiment, the conformal boron nitride film that has the insulating properties and the etching resistance is used as the protection film 23. For this reason, even though the thickness of the protection film 23 is small, the protection film 23 can be prevented from being etched in the etching process and the MTJ element 10 can be prevented from being deteriorated and the semiconductor substrate 11 can be prevented from the etching. In addition, the individual layers of the MTJ element 10 can be electrically insulated from each other and the moisture or the oxygen from the interlayer insulating film 30 can be prevented from being permeated into the MTJ element 10.

According to the present embodiment, a manufacturing cost and a manufacturing time of the MRAM 1 can be decreased by using the protection film 23 including only the boron nitride film.

According to the present embodiment, because the protection film 23 is formed to have the small thickness of 10 nm or less at the sides of the MTJ element 10, the interval between the adjacent MTJ elements 10 can be prevented from being narrowed and the interlayer insulating film 30 can be easily buried between the adjacent MTJ elements 10 without generating the void because of the protection film 23. In addition, the strong stress can be prevented from being applied from the protection element 23 to the MTJ element 10 and a characteristic of the MTJ element 10 can be prevented from being deteriorated.

According to the present embodiment, because the protection film 23 that is made of the boron nitride film is formed by using the method described above, the MTJ element 10 is not oxidized and reduced due to the protection film 23 on the sides of the MTJ element 10 or the course of forming the protection film 23. Therefore, the characteristic of the MTJ element 10 can be prevented from being deteriorated. Because the conformal protection film 23 can be formed even though the process temperature at the time of forming the protection film is the low temperature of 300° C. or less, the characteristic of the MTJ element 10 can be prevented from being deteriorated due to the heat, when the protection film 23 is formed.

In the present embodiment, the protection film 23 may cover a part of the top surface of each MTJ element 10 and the thickness of the protection film 23 that covers the part of the top surface of the MTJ element 10 may be smaller than the thickness of the protection film 23 on the sides of the MTJ element 10.

In the first and second embodiments, the semiconductor substrate 11 may not be a silicon substrate and may be another substrate. In addition, a semiconductor structure may be formed on various substrates. In the embodiments, the examples of the MRAM are described. However, the present invention is not limited thereto and may be applied to a semiconductor device such as the ReRAM that needs to protect the layers forming the resistance change element from oxidization.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a plurality of memory elements formed on a top surface of a semiconductor substrate;
   an interlayer insulating film buried between the adjacent memory elements;
   a protection film continuously formed on sides of each of the memory elements and the top surface of the semiconductor substrate between the adjacent memory elements; and
   a contact formed in the interlayer insulating film,
   wherein the protection film includes:
   a first protection film formed on the sides of each of the memory elements and the top surface of the semiconductor substrate between the adjacent memory elements, the first protection film being made of a silicon oxide film, a silicon nitride film, or a silicon oxynitride film; and
   a second protection film formed on the first protection film, the second protection film being made of a boron film or a boron nitride film.

2. The semiconductor memory device according to claim 1, wherein a thickness of the protection film is 10 nm or less at the sides of each of the memory elements.

3. The semiconductor memory device according to claim 1, wherein the memory elements are MTJ elements or resistance change elements.

4. The semiconductor memory device according to claim 1, wherein a thickness of the first protection film is smaller than a thickness of the second protection film.

5. The semiconductor memory device according to claim 1, wherein a thickness of the first protection film is larger than a thickness of the second protection film.

6. A semiconductor memory device comprising:
   a plurality of memory elements formed on a top surface of a semiconductor substrate;
   an interlayer insulating film buried between the adjacent memory elements;
   a protection film formed on sides of each of the memory elements and the top surface of the semiconductor substrate between the adjacent memory elements; and
   a contact formed in the interlayer insulating film,
   wherein the protection film includes:
   a first protection film formed on the sides of each of the memory elements and the top surface of the semiconductor substrate between the adjacent memory elements; and
   a second protection film formed on the first protection film, the second protection film being made of a boron nitride film.

7. The semiconductor memory device according to claim 6, wherein a thickness of the protection film is 10 nm or less at the sides of each of the memory elements.

8. The semiconductor memory device according to claim 6, wherein the memory elements are MTJ elements or resistance change elements.

9. A method of manufacturing a semiconductor memory device comprising:
   forming a plurality of memory elements on a top surface of a semiconductor substrate;
   forming a first protection film made of a silicon oxide film, a silicon nitride film, or a silicon oxynitride film on sides of each of the memory elements and the top surface of the semiconductor substrate between the adjacent memory elements;
   forming a second protection film made of a boron film or a boron nitride film on the first protection film;
   burying an interlayer insulating film between the adjacent memory elements; and
   forming a contact hole in the interlayer insulating film present between the adjacent memory elements by using an etching process.

10. The method according to claim 9,
wherein the second protection film is formed such that a thickness of the second protection film equals 10 nm or less at the sides of each of the memory elements.

11. The method according to claim 9,
wherein the memory elements are MTJ elements or resistance change elements.

12. The method according to claim 9,
wherein the second protection film and the first protection film are formed such that a sum of a thickness of the second protection film and a thickness of the first protection film equals 10 nm or less at the sides of each memory element.

13. The method according to claim 9,
wherein the first protection film is formed such that a thickness of the first protection film becomes smaller than a thickness of the second protection film.

14. The method according to claim 9,
wherein the first protection film is formed such that a thickness of the first protection film becomes larger than a thickness of the second protection film.

15. The method according to claim 9,
wherein the first protection film is formed by using one of a thermal ALD method, a plasma ALD method, a plasma CVD method, and a sputtering method.

* * * * *